United States Patent [19]

Cole

[11] Patent Number: 4,528,503

[45] Date of Patent: Jul. 9, 1985

[54] METHOD AND APPARATUS FOR I-V DATA ACQUISITION FROM SOLAR CELLS

[75] Inventor: Steven W. Cole, Covina, Calif.

[73] Assignee: The United States of America as represented by the Department of Energy, Washington, D.C.

[21] Appl. No.: 245,583

[22] Filed: Mar. 19, 1981

[51] Int. Cl.³ ............................................. G01R 31/26
[52] U.S. Cl. ................................ 324/158 D; 136/290; 324/158 R
[58] Field of Search ............ 324/158 D, 158 R, 73 R, 324/427; 136/290

[56] References Cited

U.S. PATENT DOCUMENTS 4,163,194 7/1979 Ross ................................. 324/73 R Primary Examiner—Ernest F. Karlsen
Attorney, Agent, or Firm—Michael F. Esposito

[57] ABSTRACT

A method and apparatus for logging current-voltage (I-V) characteristic data of a solar cell module (10) in two modes using a portable instrument. One mode controls the load current through a circuit (36) in 256 equal intervals while voltage is measured from open circuit to at least halfway into the knee of the curve and the other mode controls the load voltage through a circuit (34) in 256 equal intervals from the lowest voltage measurement possible (short circuit) to at least halfway into the knee of the curve, under control of a microcomputer (12). All measurements are packed by discarding each measurement that is within 0.5% of the value predicted from two previous measurements, except every ninth (9th) measurement which is retained. The remaining data is further packed into a memory block of a detachable storage medium (14) by recording the data points in sequence following a header containing data common to all points, with each point having the value of the controlled parameter recorded as the number of increments from the previous point recorded followed by the measured value. The detachable storage medium is preferably a solid state device for reliability, and is transferable to a playback terminal which unpacks the data for analysis and display.

10 Claims, 4 Drawing Figures

METHOD AND APPARATUS FOR I-V DATA ACQUISITION FROM SOLAR CELLS

ORIGIN OF INVENTION

The invention described herein was made in the performance of work under a NASA contract and is subject to the provisions of Section 305 of the National Aeronautics and Space Act of 1958, Public Law 85-568 (72 Stat. 453; 42 USC 2457).

FIELD OF THE INVENTION

This invention relates to a method and apparatus for logging current-voltage (I-V) measurements of arrays (panels or modules) of photovoltaic cells, and more particularly to an instrument for rapid acquisition of I-V data from solar cell arrays under varying load conditions for later read-out to a display or a computer for analysis.

BACKGROUND OF THE INVENTION

Instruments are needed with improved accuracy and with fewer of the limitations found in earlier I-V data acquisition systems for solar cell arrays. The general goal of performing measurements on any piece of equipment is to determine how well the equipment is presently functioning, and to further determine the ability of the equipment to perform a specific task. Whether the testing is done in the design, test, installation, or field service stage of the life of the equipment, the accuracy of test data is of utmost concern. For solar cell arrays, the need is to obtain as accurate a reading of each panel as possible at every point in its I-V characteristic load curve. It is thus important to devise a very accurate test instrument. If lower accuracy is demanded, the readings may be rounded off, but once the measuring instrument is built, the user is forced to live within its accuracy limits, so if higher accuracy is demanded, the instrument cannot be used. Therefore, an object of the present invention is to provide an instrument for measuring I-V characteristic data of such high accuracy as to be able to satisfy the demand of any requirement.

To obtain an accurate measurement of a specified variable, the values of all other variables which affect the reading must be set to known levels. Instruments used in the past for solar panel I-V characteristic measurements have done this by setting the current to be drawn from the panel under test and measuring the panel output voltage, or by setting the voltage across the panel and measuring the current output. Either method is very effective for a substantial portion of the I-V characteristic load curve. However as the knee of the curve is approached (where voltage begins to change at a much greater rate as current is changed or vice versa), the accuracy of the readings decrease. This is due to the relatively high change in voltage or current caused by a small change in current or voltage in this area of the load curve. The maximum number of readings in this area is also restricted by the limit of minimum current or voltage regulation steps that can be controlled.

In addition to a need for accuracy, there is a need for the instrument to be portable so that it may be carried into the field where a solar array has been installed, often in rugged terrain where it is used to recharge storage batteries for continuous power to systems at remote locations. Digital data storage in the field with portable instrumentation is at best a very difficult task. Under the rigors of various climates and atmospheres encountered in the field testing of photovoltaic solar arrays from Alaska to Panama, in the Mojave Desert, and on mountain tops in California and elsewhere, magnetic data storage media (tape or disc) will not stand up because magnetic tape and discs have been known to lose magnetic material under such extreme conditions. In the desert, sand particles and other artifacts abrade the media surfaces. Humidity and heat, or cold, create unreliable storage surfaces in the tape or disc media. Consequently, there is a need for a reliable means to collect and store digital data in the field for subsequent use. The storage medium should be readily insertable and removable from the instrument, and transferrable to a system for data display and/or a digital data processor for evaluation and analysis, such as a solid state digital storage device.

Given a reliable record media for the storage of I-V characteristic measurements, there is a need for selection of the data format to use for optimum use of the limited storage space in the media. One of the prime considerations in selecting a data format is the amount of storage available. If a high volume storage device, such as a cassette tape recorder is used, data may be stored in an easily transferable format such as ASCII encoded BCD data. Since a cassette tape would not be a reliable record media for this instrument, a low volume solid state storage device must be used. It therefore follows that the data must be packed. The object of data packing is to get as much data into a small space as possible without losing accuracy.

SUMMARY OF THE INVENTION

In accordance with the present invention, the I-V characteristics of a solar cell, or array of solar cells, is measured and recorded in two modes. One mode controls the load current in equal increments while voltage is measured from the open circuit condition to at least halfway into the knee where the percentage change in voltage is equal to or greater than the percentage change in current. The instrument is then switched into a second mode which controls the load voltage in equal increments while the current is measured from the short circuit condition to at least halfway into the knee where the percentage change in current is equal to or greater than the percentage change in voltage. That completes logging the I-V curve data from open circuit to short circuit. In an exemplary embodiment of the invention, the first mode is used for a complete set of 256 measurements from open to short circuit, and then the second mode is used for a complete set of 256 measurements from short circuit to open circuit. All measurements are stored in an input buffer memory and evaluated to determine which points may be discarded. All points are discarded that fall within 0.5% of their predicted value, where prediction is based upon the slope of the curve between two previous points, except that at least every nth point is retained. The measurements for the retained points are packed into an output buffer memory and then transferred to a detachable solid state memory, such as an erasable, programmable read-only memory (EPROM). The data is further packed by recording the data points in sequence following a header containing data common to all points, with each point having the value of the controlled parameter recorded as the number of increments from the previous point recorded followed by the measured value. The header contains the value of the increments for unpacking the data. Measurement data retained are also corrected as necessary, such as by multiplying with a calibration factor, before they are packed into the output buffer with just a number representing the number of steps of the controlled parameter (current in the first mode and voltage in the second) since the last retained measurement. The packed data are then transferred with a header to the detachable solid state memory which is plugged into the instrument for this purpose, and later into a playback terminal which unpacks the data for analysis and display. The header includes such information as time and date of data acquisition, log number, panel identification number, auxiliary data measurements used for data analysis and measured before and after data acquisition (such as temperature, solar radiation intensity and photovoltaic reference cell voltages), values to be used to convert accumulated step numbers to a measurement into a current or voltage value, and the range scale used for the measurements. The measurement data then follows in the packed form.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
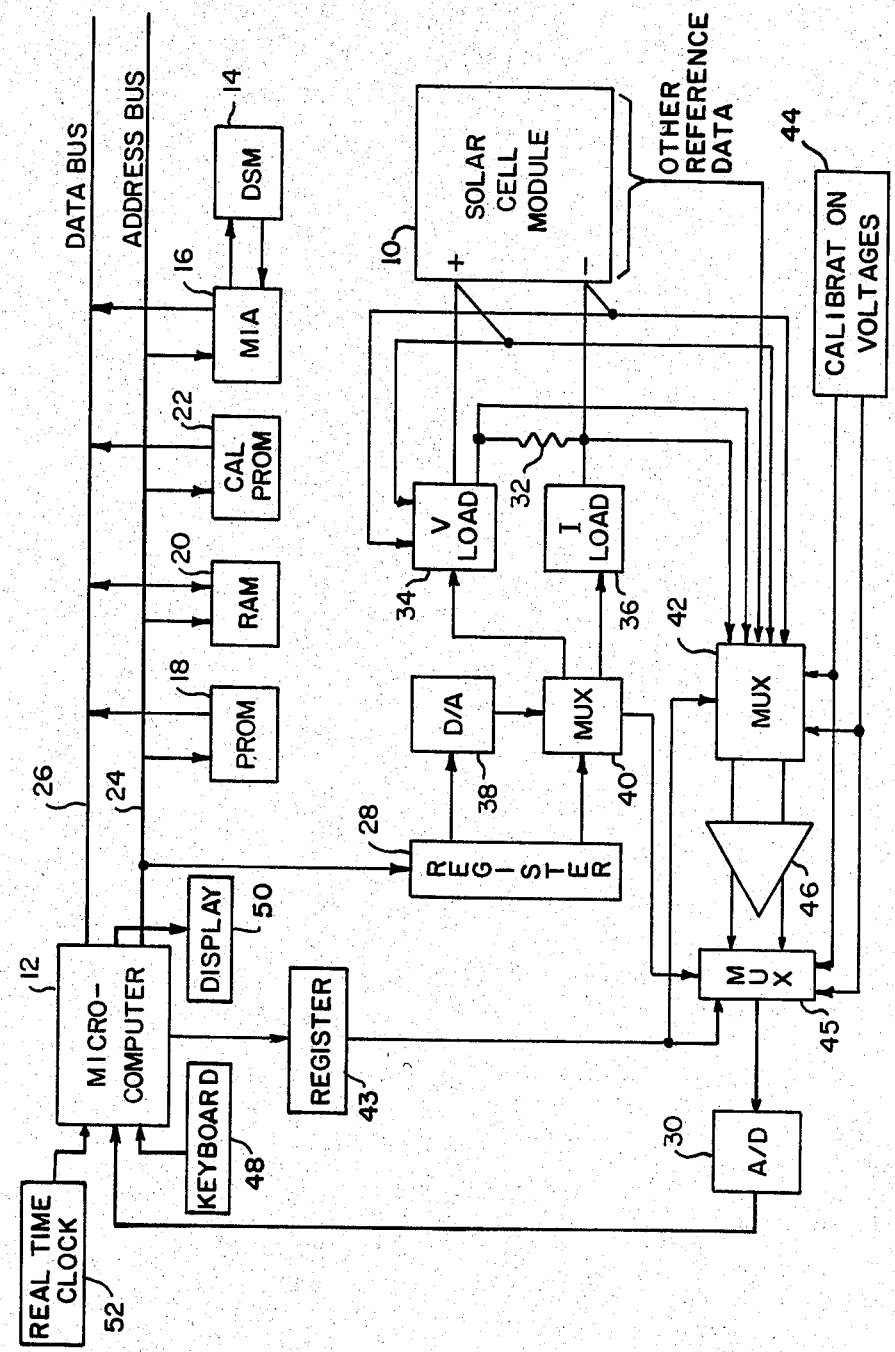
FIG. 1 is a block diagram illustrating the organization of an instrument implemented in accordance with the present invention.

Referring to FIG. 1 of the drawings, a solar cell module 10, which is only one of many making up a panel of photovoltaic cells, is connected to a system for measuring and logging I-V characteristic data under control of a microcomputer 12. The microcomputer handles all data, load control, acquisition, time keeping, data computations and user interaction functions, but what is of primary interest and the subject of this invention is just load control and data acquisition. Included in the latter function is formatting or "packing" the data for storage in a detachable storage medium (DSM) 14 connected to the microcomputer through a medium interface adapter 16.

Operation of the microcomputer is under control of a program stored in a programmable read-only memory (PROM) 18. The measurement data are first stored in a random access memory (RAM) 20 for computations which, for I-V characteristic data logging will be described with reference to FIG. 2. The processed data are then transferred to the media interface adapter 16. Other computations involve calibration which utilize data that may be stored in a calibration PROM 22. All of these devices 14–22 are connected to the microcomputer by a bus 24 for addresses and a bus 26 for data. The microcomputer thus has access to all of the devices 14–22, as well as to a register 28 for control of the I-V characteristic measurements of the module 10, and an analog-to-digital converter 30 through which the measurements are received. The way in which the microprocessor employs these devices is determined by the system program stored in the PROM 18.

In accordance with the present invention, the method of measurement divides the characteristic I-V (load) curve into two sections which will now be described with reference to FIG. 2. The first section extends from the open circuit voltage reading on the I-V curve to at least halfway into the knee. The second section extends from the lowest voltage reading possible (short circuit) to at least halfway into the knee.

To measure the first section of the curve, the load current is controlled by the microcomputer and the solar module output voltage is measured. Many measurements are taken as represented by vertical lines to the curve at predetermined increments of current. This is done to insure that any point on the curve may be extrapolated from the recorded data and still be within the specified accuracy. This principle reduces the number of points which must be recorded and it concentrates the readings in the area of greatest change, i.e., the knee.

This mode of data taking is continued at least until the unit change in voltage is equal to or greater than the unit change in current (% of full scale) or to a point of lowest voltage possible. This latter alternative is the one selected for the exemplary embodiment to be disclosed. In either case, once the first mode of measurement is terminated, the microprocessor switches to the second mode of data acquisition in which the solar module is loaded to produce specified output voltages starting with short circuit (zero volts), and the required currents are measured. Again, the measurements are stopped either at about the center of the knee, or as in the exemplary embodiment, at open circuit (maximum voltage).

For this second mode, voltage is regulated from zero volts (short circuit) to maximum voltage at predetermined increments, and current measurements are made, as represented by the horizontal lines to the load curve. The zero voltage point cannot be measured because of the drop across the current sensing device (resistor) 32 and the voltage regulating circuit 34. However, the value of this short circuit point may be calculated from obtainable and stored curve data as the last "reading" recorded. A current regulating circuit 36 controls the load of the panel during the first mode of measurement. These voltage and current control circuits will be described with reference to FIGS. 3 and 4. Each is controlled by a voltage signal from a digital-to-analog converter 38 via a switch 40 which is set to control the current load circuit during the first mode of operation and to control the voltage load circuit during the second mode. The digital-to-analog converter and the switch are set for each controlled measurement by the register 28 which receives an appropriately coded instruction. In the simplest form, the instruction is a binary code word specifying the current or voltage load, and a flag bit specifying mode 1 or mode 2. The flag bit may then control the switch directly, while the binary code is used for the analog-to-digital converter. In addition, the instruction includes an operation code utilized to control a multiplexer 42 for three different operations.

The first operation is a calibration operation, during which the multiplexer steps through a plurality of regulated voltages from a source 44 for calibration of the instrument. These calibration voltages are passed by an amplifier 46 to the analog-to-digital converter 30 as though it were a load curve measurement. The calibration procedures will be described more fully hereinafter. The other operations are, of course, load curve measurements in mode 1 and mode 2.

The data from the measurements are stored in the random access memory 20 for packing. During this process of packing some of the measurements are discarded, resulting in fewer data points to be stored, except at the knee where it is advantageous to have a larger number of data points for plotting and analysis due to the rate of change in the slope of the load curve.

An exemplary method of data packing is to break up data to be recorded into two blocks. The first block is a header containing information common to all data points, including the date, time, serial number of the recording device, test panel number and other information supplied by the user through a keyboard 48. The data block then follows. As noted above, some data points not necessary for accurate plotting of an I-V curve are discarded. The manner in which that is done is described hereinafter.

In addition to the foregoing, data relating to the conditions under which the load curve data points are measured may be desired for analysis of the modules tested. These conditions are the temperature of the module, the intensity of solar radiation and the response of reference cells. These would be provided through the multiplexer under control of the microcomputer. In normal operation the field operator will connect a solar module to be evaluated to the instrument through a cable. He will also connect thermocouples, pyranometers and reference signal cells through a connector (not shown). The operator will then press and release a power ON button (not shown) applying power to the instrument. When the microcomputer comes up, it does a memory test. During this time, all segments of the display 50 are turned on as a display segment test.

After the completion of the memory test, the display changes to "on". During this time the microcomputer calibrates various input and load control channels. When the calibration is complete, the computer reads and stores in the random access memory 20 the open circuit voltage output of the solar module and determines the 110% voltage range to be used with the full scale voltage for the mode-2 measurements. One of the voltage loads is then turned on and maximum current is read by the computer and stored in the random access memory 20. From this reading the microcomputer determines the 110% current range to be used with the full scale current for the mode-1 measurements. The voltage load is turned off immediately following the current reading. When the current and voltage range scaling is complete, the display indicates module data is being taken. The microcomputer then reads the auxiliary inputs (thermocouple, pyranometer and reference cell). These readings are stored in the random access memory 20. The proper current load is then used to scan the solar module. Voltage measurements at 256 evenly spaced current intervals are taken at this time. The readings are stored in the random access memory. The proper voltage load is then turned hard on and the load saturation voltage is read by the microcomputer. Since a voltage load circuit (fully described below) is used to load the module, current readings below this voltage saturation point—typically 1 to 1.5 volts—are not possible. This load saturation voltage is used as a starting point for the voltage control, current measurement readings. 256 current measurements are taken at evenly spaced voltage intervals. The auxiliary inputs are again read by the computer and the readings stored in a separate area of the random access memory. The display then indicates that all readings have been taken.

A hardware real-time digital clock 52 is read. From this information the date and time is determined. The date and the time are then stored in the random access memory 20 output buffer. The time is also stored in a scratch pad section of the random access memory. Time keeping from this point until the system is turned off is carried on as a software task. The display 50 then calls for the operator to enter a 4 digit identification (ID) number and a 4 digit log number through the keyboard 48.

While the operator is entering this information, the microcomputer is processing the stored measurements. First, it corrects the auxiliary readings using the information obtained during the power up calibration. Each measurement channel has a calibration factor associated with it. The voltage measurement readings are then corrected for the measurement channel's calibration factor. Points which then can be predicted within 0.5% of actual measurement are automatically dropped to save detachable medium storage space. The current readings are then corrected and condensed in the same manner.

Figure 2:
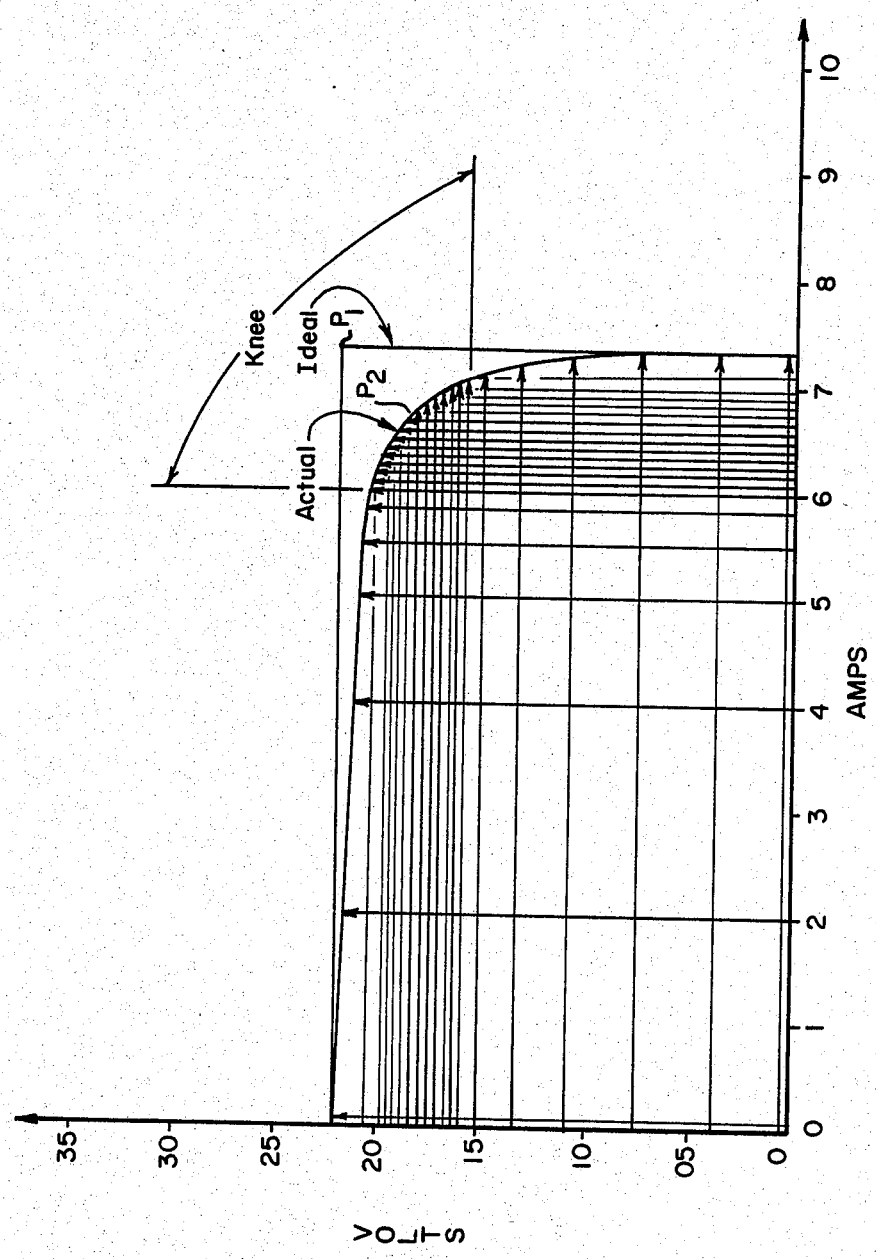
FIG. 2 is a graph of typical I-V characteristic data.

Peak power, peak current and a fill factor are calculated during this time, where: the peak power is a calculated point $P_1$ (FIG. 2) about halfway through the knee of the curve; peak current is the calculated short circuit current at zero volts; and the fill factor is the ratio of $P_1$ to $P_2$, where $P_2$ is the product of the short circuit current and the open circuit voltage at the corner of the ideal I-V curve (FIG. 2). As was mentioned before, the module output current at zero volts cannot be measured. The peak current value calculated here is the calculated zero voltage crossing point. The slope between two current measurement points close to the load saturation point is used to determine this value. The open circuit voltage reading, calculated peak current, and calculated peak power are then used to calculate the fill factor. These numbers may be used for display purposes only, in which case they are not stored with the I-V measurement data. By the time the operator completes entering the 4 digit log and ID numbers the microcomputer will have finished these calculations and be ready to display the results and to store the measurements acquired during the data run in the removable medium.

The operator can use the data display unit 50 to obtain the peak current, open circuit voltage, fill factor, peak power, temperature, pyranometer, and reference cell readings—also the time of day and date. The displayed data can be used to correct the time of day, the date, the ID number, and the log number if correction is necessary. If the date or time is altered, the microcomputer will correct that parameter in the random access memory output buffer.

When the operator uses the keyboard 48 to either acquire a new set of I-V data measurements, or request the instrument to turn itself off, the information in the packed I-V data in the random access memory output buffer is transferred into the detachable storage medium 14. Once the storage is complete, the microcomputer checks the stored data to confirm that it is accurate. When the data medium check is completed, the system either acquires a new set of I-V, measurements, or turns itself off, depending upon the operator's instruction.

Figure 3:
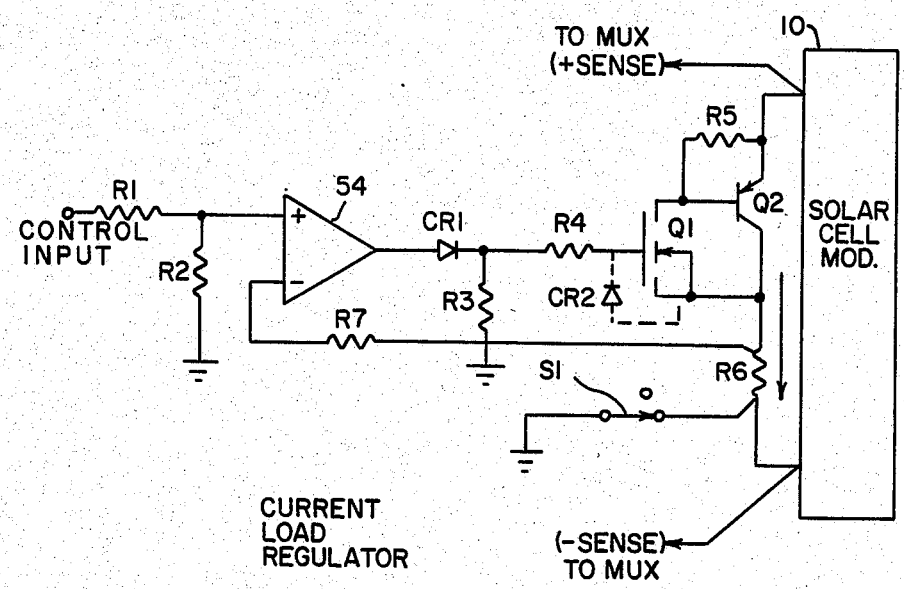
FIG. 3 is a circuit diagram of a current load controller.

Referring now to the current load control circuits shown in FIG. 3, the voltage divider resistors formed by resistors R1 and R2 decrease the current control input by an order of magnitude. If this potential is more positive than the voltage drop across a current sensing resistor R6, the output of an operational amplifier 54 goes positive. This positive going voltage turns a transistor (MOSFET) Q1 on. This provides base drive to a junction transistor Q2. This increase solar module current $I_1$, which in turn increases the voltage drop across the resistor R6, to provide the feedback signal. Resistor R7 in series with the current sense resistor balances input offset voltage caused by the operational amplifier currents. Should the amplifier output voltage go below ground, a diode CR1 and a resistor R3 prevent a power transistor protection diode CR2 (internal to the MOSFET) from becoming forward biased. This is done to decrease the voltage drop across internal resistances in the current sense return switch S1 shown in FIG. 3 for clairty, although in actuality it is an electronic switch in the multiplexer 40 (FIG. 1) closed by the microcomputer by the control word in the register 28. Resistor R5 aids in the turn off of transistor Q2. In operation, the current load control circuit is stepped through predetermined current levels while the voltage across the solar panel is sensed through the multiplexer 42 (FIG. 1). When the first mode of I-V load measurement is complete, the transistors are turned off by the control input and the switch S1 is opened.

Figure 4:
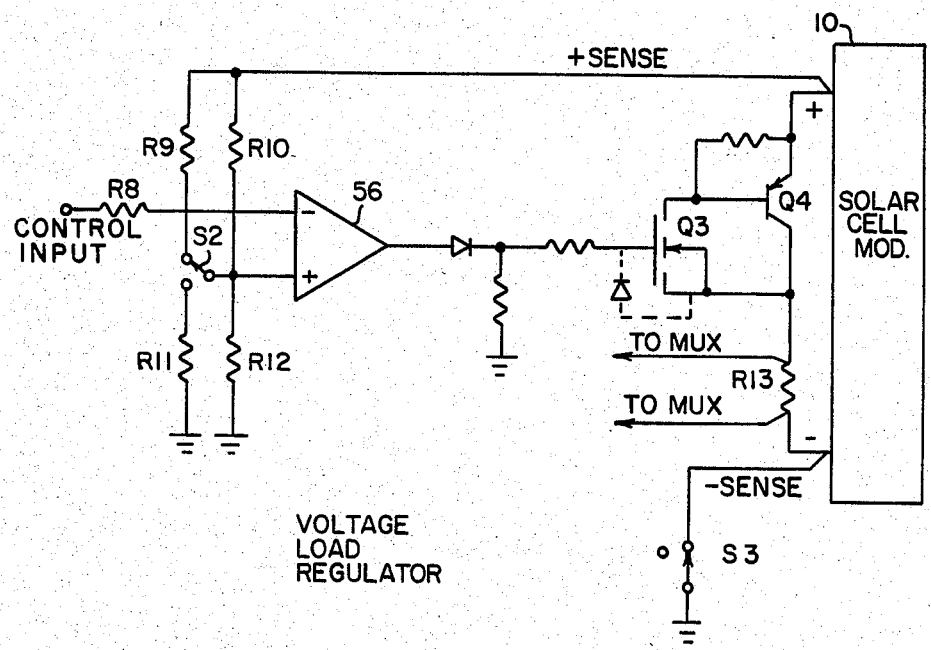
FIG. 4 is a circuit diagram of a voltage load controller.

Referring next to the voltage load circuit shown in FIG. 4, the voltage control input is applied to an operational amplifier 56 through a resistor R8. A voltage divider formed by resistors R9 through R12 is used to scale the solar module output voltage. All four of these resistors are the same value. If a switch S2 (in the multiplexer 40 of FIG. 1) is up as shown, resistors R9 and R10 form a parallel network. The value of this network is half of R12. Therefore the module output voltage is divided by 3/2. If the switch S2 is down, resistors R11 and R12 form a parallel network. This network divides the module output voltage by three. This voltage dividing action results in two voltage ranges which may be selected for use in the instrument, i.e., 15 volts and 30 volts, respectively.

If the solar module sense voltage, after division by the above network, is more positive than the control input voltage, the output of the operational amplifier 56 will go positive. This positive-going voltage turns on a power transistor Q3, which turns transistor Q4 on. As more current is drawn from the solar module the module goes into a constant current mode and its output voltage falls. This falling output voltage is sensed through the divider network, providing the feedback signal. The current measurement signal is the voltage sensed across a resistor R13. A switch S3 is closed, as shown. This switch is also an electronic switch in the multiplexer 40.

These two load circuits shown in FIGS. 3 and 4 are designed to be very stable for relatively long periods of time. To achieve load accuracy, the microcomputer scales the digital output value sent to the digital-to-analog converter 38 (FIG. 1) by the output load's calibration factor.

It should be noted that although only one current load and one voltage load circuit is shown, in practice there are two load circuits of each type in the system due to the difficulty in switching current sense resistors R6 and R13. One load circuit of each type is used for a zero to 2 amp range, and the other for a zero to 10 amp range.

In operation, the load circuits are controlled by the microcomputer through the register 28 and the multiplexer 40 which, in response to a proper instruction, activates a current load or a voltage load circuit with the appropriate control input and sets the appropriate ones of the switches S1 through S3 in the appropriate positions. (The purpose for the switches S1 and S3 is to establish the correct voltage return or ground reference for the load circuits.) At the same time, the multiplexer 40 (FIG. 1) directs the output of the digital-to-analog converter 38 to the selected load control circuit, also under control of the instruction from the microcomputer stored in the register 28. The current or voltage level specified by the instruction is thus converted by the digital-to-analog converter and applied to the selected load control circuit.

In operation, the analog signal is first applied to the current load control circuit 36. The current is sensed by the resistor R6 (FIG. 3) which produces a feedback signal to the inverting input terminal of the operational amplifier, thereby stabilizing the current load while the voltage across the module is being sensed through the multiplexer 42 which is also being controlled by the current instruction in the register 28. The voltage thus sensed is amplified by the amplifier 46 and converted from analog to digital form in the converter 30. The microcomputer program in the programmable read only memory 18 then causes this digital value of voltage to be stored in the random access memory 20 before stepping to the next current control point. The process continues through 256 equally spaced control points.

Once a predetermined maximum current (vertical short circuit) has been reached in logging the I-V characteristics of the solar cell module, the microcomputer program begins logging the I-V characteristics by controlling load voltage in the circuit 34 and measuring current in a similar manner. The load current sensed by the resistor R13 (FIG. 4) is now used as the output being measured. When the programmed microcomputer has stepped through all of 256 voltage points, packing the data stored in the random access memory (RAM) 20 may commence.

In packing the data first stored in an "input buffer" section of the RAM, it is transferred in packed form into an "output buffer" section of the RAM. When that is complete, it is transferred to the detachable storage medium 14, which in this exemplary embodiment is chosen to be an erasable programmable read-only memory (EPROM), such as an Intel 2716 which has 16k bits of ultraviolet erasable and electrically programmable read-only memory with fast (up to 50 ms) single address location programming.

Once the packed data has been transferred into the detachable storage medium 14, it is read back and compared against the random access memory output buffer for error checking. If an error has occurred, the data already stored is marked with an error flag, and the packed I-V data is again transferred into a succeeding block of memory in the detachable storage medium.

An exemplary procedure for measuring and packing the I-V data will now be summarized. First the scale factors are determined and the auxiliary inputs are read. When it is time to start measuring the I-V data, the current load is used to gradually increase module output current in evenly spaced steps as the module output voltage is read. Each step is equivalent to 1/256 of 110% of the maximum module output current. This value is calculated after the proper current range is determined. These voltage readings are stored in read/write memory for future use. After all voltage readings are taken with the circuit of FIG. 3, the voltage control load circuit is turned full on. The microcomputer then reads the load saturation voltage. This value is converted into the starting solar module output voltage load point. The voltage is increased in steps as the current for each set point voltage is measured by the voltage drop across resistor R13 (FIG. 4). The last current measurement is made with the voltage point set to 110% above the open circuit voltage reading. It is recognized that the voltage measurement and load control circuits draw a small amount of current from the solar module. This current is highly dependent upon module voltage and is not measured by the current sense resistors. This current, however, is limited to 3 milliamps with a module voltage of 30 volts. This value is 0.15% of the 2 ampere range and 0.03% of the 10 ampere range selected by the switch S2 (FIG. 4).

After the I-V data measurements have been stored in the input buffer of the random access memory, the microcomputer starts correcting and packing the data for storage. The first voltage measurement (open circuit module output voltage) is corrected for the calibration factor calculated during calibration prior to data acquisition. This measurement is then stored in the output buffer of the random access memory as the first I-V data point. The next voltage reading is corrected for the calibration factor and the slope between these two points is determined. The third voltage measurement is then corrected. If this value is within 0.5% (of full scale) of the predicted value, using the calculated slope, the point is discarded. This process continues until the difference between the measured and predicted values exceeds 0.5%, or until the 9th reading is evaluated. This point then becomes the next data point in the I-V curve. The value is stored in the output buffer with the number of steps from the last retained measurement representing the current set point for that value. The slope between the voltage measurement just stored and the previous measurement stored in the output buffer is then determined. The next measured point in the input buffer is corrected and evaluated using this new slope and either discarded or stored in the output buffer.

This process continues until the slope is equal to or greater than 2 (delta reading divided by delta set point in binary). At this time the remaining voltage readings in the input buffer are corrected and the incremental slope is determined. This process continues until the end of the input buffer is reached, or the incremental slope is equal to or less than 1. When this slope is detected a flag is stored in the output buffer with the number of control steps to that location corresponding to the current set point at that location. The voltage measurement which generated the slope equal to or less than 1 is stored next. The above procedure for data packing is then resumed until the slope is again equal to or greater than 2, or until the end of the input buffer is reached.

Each time a voltage measurement is stored in the output buffer, the power at that point is calculated. If this calculated value is greater than the highest value previously calculated, the new value is stored in a peak power memory location. Thus, when the packing procedure has been completed, the highest calculated power value will have been stored. This calculation is only made on the mode-1 (current control, voltage measurement) data.

As noted hereinbefore, the voltage load circuit (FIG. 4) is incapable of completely shorting the solar module. The first two current measurement readings in the input buffer were taken very close to the load saturation point. The first current measurement in the input buffer is now corrected and stored in the output buffer. The second current measurement in the input buffer is then corrected for the current measurement calibration factor. The slope between these two points is then determined. Using this slope, the zero voltage current is calculated. This calculated value is stored and used in the system as peak current, but is not stored in the output buffer. The fill factor (calculated peak power divided by the product of peak voltage multiplied by peak current) is then calculated using the measured and calculated values. This value is also stored. None of these calculated values are stored in the output buffer for transfer to the removable storage medium. They are stored for display purposes only, and are lost on power off or when new I-V data is taken.

Each block of packed I-V measurement data is accompanied by an identifying header divided into three sections: clock and log information, auxiliary data taken prior to the I-V data, and auxiliary data taken after I-V data. The time and log information is stored in binary coded decimal (BCD) form with 2 digits per location. It includes the time and data acquisition. The panel temperature is stored in binary form ($00_{16}=0°$, $80_{16}=128°$ F.). The remaining auxiliary measurements are 12 bit readings stored left justified and unsigned. The four least significant bits are "don't care." Between the header and the I-V data are seven locations. These locations contain two 3-byte floating-point numbers which are the percent of range values calculated prior to I-V data acquisition. They represent the current and voltage load per load step in the I-V curve data. The seventh location indicates the ranges used during data acquisition. The I-V data follows this seventh location.

The I-V data block is divided into two sections. The first section of data contains the measurements taken in the first (controlled current) mode. The second section of data contains the measurements taken in the second (controlled voltage) mode. The storage format is the same for both sections. The 12 most significant bits contain the unsigned measurement where $FFF_{16}$ is full scale minus 1/4098 of full scale. The least significant 4 bits contain the step in the control value from the previous measurement. These steps are added together to find the set point for each reading. $FF_{16}$ multiplied by the percent of range value is the highest load value.

If the I-V curve mode 1 or 2 has been interrupted due to the slope changes mentioned above, a discontinuity flag $0F_{16}$ is stored in the output buffer at the point where the curve mode 1 or 2 is resumed. The following byte contains the absolute load set point at which the curve mode 1 or 2 is continued. The data measurement following the discontinuity flag is taken at the load set point indicated in the flag. Following this data point, the readings continue as usual. Between modes, a mode change flag $00_{16}$ is stored in place of the load step value for much the same purpose as the discontinuity flag. The following byte contains the load step value at which the first current measurement was taken.

From the foregoing, it is evident that the data values of packed data are stored in sequential pairs, with the first value of the pair representing the control current or voltage point relative to the last retained point and the second representing the voltage or current measurement. The data packing function is thus effective in not only discarding all unnecessary measurements in the two modes, leaving only meaningful overlap of the data in the two modes at the knee of the curve where a greater density of data points is desirable due to the rate of change of the curve in that region, but also in reducing the number of bytes necessary to accurately define the value of the controlled parameter for each measurement point. The playback terminal (not shown) is preferably implemented as a microcomputer system programmed to unpack and convert the data to engineering units, and to output the converted data to a data processing system or display terminal. Data playback is controlled as though the storage medium were a tape drive to read out all measurements stored in one block of the medium.

With calibration, the instrument thus implemented will provide rapid acquisition of I-V data under varying load conditions with as high accuracy as possible at any point in the load curve. As noted hereinbefore, if lower acuracy is sufficient, the measurements can be rounded off, but the user is not forced to use the instrument within those lower limits of accuracy. The data recorded is with the highest accuracy possible, so the data are useful at such high accuracy limits.

Periodically (approximately every six months) the instrument should be returned for bench calibration. During this bench calibration, numbers representing the time, date, and the precise gain of each measurement and load control channel in the system is stored in a 16k bit removable data medium, the calibration programmable read-only memory 22 (FIG. 1). The microcomputer evaluates this module upon turning power on and before each data acquisition to aid in the determination of calibration factors for each input and control channel and to set the time and date. The bench calibration procedures include determining the gain of the analog-to-digital converter 30 and amplifier 46, and the gain of the input scaling networks for the voltage measurements. From these values, the final calibration factor is calculated and stored in the memory 22.

In a similar manner, the gain of the digital-to-analog converter 38 is determined and stored. Here the analog-to-digital converter is used as a transfer standard and the output of the digital-to-analog converter is read. The bench calibration values are then recalled from the memory 22. The values recalled represent the exact gain of the load circuits. The calibration factors for the load circuits themselves are then calculated and stored in the memory 22. A value to be output is multiplied by the proper calibration factor to compensate for gain errors of the load circuit and digital-to-analog converter.

The hardware real-time clock 50 (FIG. 1) is powered by storage batteries. The clock is made up of various low power logic circuits forming a 10 digit BCD counter. The counter is clocked at a 1 Hz rate. The clock could theoretically count seconds for approximately 30 years without overflowing. During a bench calibration the 10 digit BCD counter in the real-time clock hardware is set to zero. The time and date when the clock was zeroed is input to the system through the keyboard 48. The microcomputer then calculates the number of seconds which have passed from zero hundred hours of a predetermined date. This number in seconds is stored in the calibration PROM with the other calibration information. Upon power up before the solar I-V data have been taken, the hardware real-time clock is read. This is the number of seconds which have lapsed since the clock was reset. The number of seconds stored in the memory 22 and the clock output are added together. The microcomputer then calculates the number of hours, minutes, seconds, months, days and years represented by these seconds. Adding the result, to zero hundred hours of the predetermined date, gives the proper month, day, year, hour, minute and second that the real-time clock was read just prior to the time of I-V data logging. At this time a real-time clock software interrupt is set up. Time keeping from this point until the system is turned off is maintained by this software.

From the foregoing, it is seen that an instrument is provided for rapid acquisition and storage of I-V data from solar cell panels under varying load conditions with the highest possible accuracy by measuring voltage as current is varied from open circuit to at least the middle of the knee in the curve, and preferably to short circuit, and measuring current as voltage is varied from short circuit to at least the middle of the knee, and preferably to open circuit. The measurements are stored in an input buffer, and packed (compacted) in the process of transferring the data to an output buffer by utilizing the technique of retaining the next point only if it deviates more than a very small percent, e.g., 0.5%, from the point predicted using the slope between the last two points in the curve. This will result in data points spaced far apart until the knee of the curve is entered. The packed data is then transferred in a predetermined format to the detachable storage media 14 (FIG. 1) for off-line playback and analysis at a suitable terminal into which the detachable storage memory is transferred. The preferred storage medium is an EPROM which plugs in through a connector to a media interface adapter 16 of the instrument, and similarly plugs into a suitable terminal where it is read out in block sequence as though it were a tape storage medium. However, unlike a magnetic storage medium, an EPROM will record very reliably under the most extreme conditions of temperature, weather and sand storms.

The EPROM is an integrated circuit having internal capacitive memory cells which are charged under programmed control and remain charged until discharged by ultraviolet radiation. The charge is maintained even after it is sensed to read out the data stored so that the data cannot be lost, except by inadvertent programming of data to be stored in the same memory locations. The EPROM is mounted on a circuit board in a small container for connection of its terminals, one for one, to a multipin plug selected to fit a connector (receptacle) on the instrument, and on the playback terminal. The playback terminal uses block pointers stored in the medium at fixed locations to access the block of memory locations stored. By simply accessing the pointers in a systematic way, the records may be accessed just as though stored in a magnetic tape or other more conventional memory.

From the foregoing, it is evident that a new and improved method is provided for logging the current-voltage data characteristics of the operation of an array of solar cells between open circuit and short circuit using a detachable solid state memory device. Measurements are made in two modes. In one mode the current is controlled, and in the other the voltage is controlled.

The composite of the resulting measurements will thus define with significantly improved accuracy the I-V characteristics of the array on either side of the knee as well as the knee. To conserve limited data storage space in the solid state memory device, the data is packed into a block composed of a header containing data common to all measurements, followed by the measurements in first one mode and then the other with only every nth data point being retained, along with other points that do not fall within 0.5% of the value predicted from the slope of previous points as the measurements are reviewed in sequence in each mode prior to their storage in the detachable storage device, with the controlled variable for each measurement stored, specified in terms of the number of intervals from the last measurement stored. That device may then be transferred to a playback terminal used to read out the block of data for display and/or analysis. Although a specific embodiment has been described and illustrated herein, it is recognized that modifications and equivalents may readily occur to those skilled in this art. Consequently, it is intended that the claims be interpreted to cover such modifications and equivalents.

What is claimed is:

1. A method for logging current-voltage data characteristics of the operation of an array of solar cells between open-circuit and short-circuit load conditions comprising the steps of
controlling load current in one mode while voltage is measured from open circuit to at least halfway into the knee of the curve where the percentage change in voltage is equal to or greater than the percentage change in current, and
controlling the load voltage in a second mode while current is measured from the lowest load voltage possible to at least halfway into the knee of the curve where the percentage change in current is equal to or greater than the percentage change in voltage.

2. A method as defined in claim 1 wherein a predetermined number of measurements are made while changing load current in equal intervals, and a predetermined number of measurements are made while changing load voltage in equal intervals, both sets of measurements extending between the two extremes of open circuit and the lowest load voltage possible, and including the further steps of initially storing all measurements in both modes, and then analyzing the measurements in each mode except the first to discard those measurements which do not fall outside a predetermined percentage from predicted values, where values are predicted from the slope of the line defined by the last two points retained.

3. A method as defined in claim 2 wherein data of retained measurement points is packed into a sequence of stored measurements, each accompanied by the number of control parameter intervals from the last point retained, and including stored values for converting the number of controlled parameter intervals between retained values to absolute parameter values.

4. A method as defined in claim 3 wherein the packed data is stored in a detachable solid-state storage medium connected to said instrument, and including the further step of transferring said detachable storage medium to a playback system for analysis and display.

5. A method as defined in claim 4 including the steps of providing as a header data common to the current-voltage data logged for a particular array of solar cells.

6. Apparatus for logging current-voltage data characteristics of the operation of an array of solar cells between open-circuit and short-circuit load conditions comprising
means for controlling the load voltage of said array points between and including open circuit and short circuit,
means for selectively controlling the load current of said array at points between and including open circuit and short circuit,
means for sensing the voltage output of said array under varying load conditions,
means for sensing the current output of array under varying load conditions,
means for operating said current load control means for selectively controlling at intervals the current load of said array while said voltage output is sensed from open circuit to at least the point where the percentage change of voltage is equal to or greater than the percentage change of controlled current,
means for operating said voltage load control means for selectively controlling at intervals the voltage of said array while said current output is sensed from short circuit to at least the point where the percentage change of current is equal to or greater than the percentage change of controlled voltage, and
means for storing each value of sensed current and voltage output in digital form.

7. Apparatus as defined in claim 6 including
means for analyzing the stored voltage data to determine which values may be discarded as unnecessary for defining the current-voltage characteristic of said array based on the criterion of a voltage value which does not exceed a value predicted from the slope of a line between the last two recorded and retained voltage values,
means for analyzing the stored current data to determine which values may be discarded as unnecessary for defining the current-value characteristics of said array based on the criterion of a current value which does not exceed a value predicted from the slope of a line between the last two recorded and retained current values, and
means for storing the packed data for later analysis and display.

8. Apparatus as defined in claim 7 wherein said means for operating said voltage and current load control means selectively controls voltage and current, respectively, in steps of equal intervals, and including means for further packing data by computing for each recorded value retained the number of equal intervals of the controlled parameters from the last step retained value and storing as the value of the controlled parameter that number, whereby a given data point is defined as the accumulated incremental steps to that point and the measured variable.

9. Apparatus as defined in claim 7 or 8 wherein said packed data is stored in a detachable storage medium.

10. Apparatus as defined in claim 9 wherein said detachable storage medium is comprised of a solid state memory device.

* * * * *